US011328902B1

(12) United States Patent
Rummel (10) Patent No.: US 11,328,902 B1
(45) Date of Patent: May 10, 2022

(54) RADIO FREQUENCY GENERATOR PROVIDING COMPLEX RF PULSE PATTERN

(71) Applicant: XP Power Limited, Singapore (SG)

(72) Inventor: Paul Rummel, Lakewood, CO (US)

(73) Assignee: XP Power Limited, Singapore (SG)

( * ) Notice: Subject to any disclaimer, the term of this patent is extended or adjusted under 35 U.S.C. 154(b) by 0 days.

(21) Appl. No.: 17/343,539

(22) Filed: Jun. 9, 2021

(51) Int. Cl.
*H01J 37/32* (2006.01)
*H03K 3/012* (2006.01)
*H03K 21/08* (2006.01)
*H03K 3/037* (2006.01)
*H03K 7/08* (2006.01)

(52) U.S. Cl.
CPC ........ *H01J 37/32146* (2013.01); *H03K 3/012* (2013.01); *H03K 3/037* (2013.01); *H03K 7/08* (2013.01); *H03K 21/08* (2013.01)

(58) Field of Classification Search
CPC . H01J 37/32146; H01J 37/32174; H03K 7/08
See application file for complete search history.

(56) References Cited

U.S. PATENT DOCUMENTS

| 4,500,563 | A | 2/1985 | Ellenberger et al. |
|---|---|---|---|
| 6,395,641 | B2 | 5/2002 | Savas |
| 6,472,822 | B1 | 10/2002 | Chen et al. |
| 7,166,233 | B2 | 1/2007 | Johnson et al. |
| 8,264,154 | B2 | 9/2012 | Banner et al. |
| 8,298,625 | B2 | 10/2012 | Stimson et al. |
| 8,404,598 | B2 | 3/2013 | Liao et al. |
| 8,692,467 | B2 | 4/2014 | Benjamin et al. |
| 8,704,607 | B2 | 4/2014 | Yuzurihara et al. |
| 8,736,377 | B2 | 5/2014 | Rughoonundon et al. |
| 8,883,028 | B2 | 11/2014 | Kanarik |
| 9,123,509 | B2 | 9/2015 | Papasouliotis et al. |
| 9,368,329 | B2 | 6/2016 | Valcore, Jr. et al. |
| 9,396,900 | B2 | 7/2016 | Lane et al. |
| 9,721,758 | B2 | 8/2017 | Coumou et al. |
| 9,741,539 | B2 | 8/2017 | Kawasaki et al. |
| 9,788,405 | B2 | 10/2017 | Kawasaki et al. |
| 9,872,373 | B1 * | 1/2018 | Shimizu ................. H01J 37/321 |
| 9,966,231 | B2 * | 5/2018 | Boswell .................. H02M 1/14 |
| 10,340,123 | B2 | 7/2019 | Ohtake |
| 10,580,623 | B2 | 3/2020 | Ye et al. |
| 2011/0192349 | A1 | 8/2011 | Hammond, IV et al. |
| 2013/0119018 | A1 | 5/2013 | Kanarik et al. |
| 2017/0372912 | A1 | 12/2017 | Long et al. |
| 2018/0182600 | A1 | 6/2018 | Sohn et al. |

* cited by examiner

*Primary Examiner* — Patrick O Neill (57) ABSTRACT

A radio frequency (RF) generator includes a pulse generator circuit configured to receive input signals indicative of a pulse pattern defining an envelope of a pulse RF signal. The pulse generator circuit stores data values defining power levels and durations of segments of the pulse pattern. The pulse generator generates a pulse modulation control signal responsive to the stored data values, the pulse modulation control signal being indicative of the power level and the duration of each segment of the pulse pattern, the pulse modulation control signal being provided to a control circuit to generate a control signal to adjust the amplitude and to modulate the duration or width of the RF signal to generate the pulse RF signal having the pulse pattern.

20 Claims, 6 Drawing Sheets

RADIO FREQUENCY GENERATOR PROVIDING COMPLEX RF PULSE PATTERN

FIELD OF THE INVENTION

The invention relates to a radio frequency (RF) generator and, in particular, to an RF generator capable of generating complex pulse patterns as the RF output signal using simple circuitry.

BACKGROUND OF THE INVENTION

A radio frequency (RF) generator or RF power supply is an industrial equipment used for supplying RF energy to a load device. RF generators are commonly used in the semiconductor industry, such as in plasma semiconductor equipment for generating plasma for manufacturing silicon wafers. A typical RF system may include an RF generator and an impedance match network driving a load, such as a plasma chamber. The RF power generated by the RF generator are precisely controlled so as to realize the desired process conditions. In semiconductor applications, the RF generator may generate a continuous wave (CW) signal or a pulse-modulated signal. A pulse-modulated RF generator applies the RF signal by pulsing the RF signal to the load.

More specifically, modern plasma semiconductor processes often use RF energy that is pulsed. Pulsed plasmas can result in a higher etching rate, better uniformity, and less structural, electrical or radiation (e.g. vacuum ultraviolet) damage. Pulsed plasmas can also ameliorate unwanted artifacts in etched micro-features such as notching, bowing, micro-trenching and aspect ratio dependent etching. As such, pulsed plasmas may be indispensable in etching of the next generation of microdevices with a characteristic feature size in the sub-10 nm regime.

Pulsing requirements for RF generators driving plasma processes have evolved from simple on/off output power pulsing to more complex multiple levels of pulsing, each output power level with different timing requirements. These more complex requirements demand more complex circuits to provide the pulsing signals to modulate RF power output. Current solutions for providing pulsing signal include using a timing circuit for each pulse power level, where such implementation limits the complexity of the RF pulse signal modulation that can be realized. For example, in the conventional solution, a need for three-level RF signal pulsing requires typically 4-6 timing circuits to develop the pulse pattern. Conventional pulse timing control solutions are not practical when demands for greater process control call for large number of pulse levels, such as 10 or 100.

BRIEF DESCRIPTION OF THE DRAWINGS

Various embodiments of the invention are disclosed in the following detailed description and the accompanying drawings.

FIG. 5, which includes FIGS. 5(a) and 5(b), includes exemplary pulse-modulated RF signal waveforms which can be generated by the RF generator in embodiments of the present disclosure.

FIG. 4, which includes FIGS. 4(a) and 4(b), illustrates the configuration of the digital memory in the pulse generator circuit in embodiments of the present disclosure.

DETAILED DESCRIPTION

According to embodiments of the present disclosure, a radio frequency (RF) generator incorporates a pulse generator circuit to generate complex and arbitrary pulse modulation of an RF signal. In some embodiments, the pulse generator circuit includes a divide-by-n timer in communication with a digital memory storage storing in a set of memory locations the specifications for the desired pulse modulation. The pulse generator circuit generates a pulse modulation control signal defining an envelope for the pulse-modulated RF output signal. The shape of the envelope of the pulse-modulated RF output signal can have complex forms, as specified by the specifications stored in the digital memory storage. In particular, the pulse generator circuit of the present disclosure enables the RF generator to deliver a pulse-modulated RF output signal having any pattern shape. Providing complex patterns of RF power delivery lead to new level of process control in RF-driven semiconductor equipment.

The pulse generator circuit of the present disclosure enables the RF generator to generate pulse-modulated RF signal with high level of RF envelope complexity, a complexity level not readily achievable using conventional RF pulse generation methods. In particular, the pulse generator circuit of the present disclosure does not require multitude of timing circuits. For example, conventional RF pulse generation methods often require one timing circuit for each desired pulse level. The pulse generator circuit of the present disclosure is simple to implement and is cost effective to construct while providing greater flexibility and improved performance as compared to conventional RF pulse generation methods.

Figure 1:
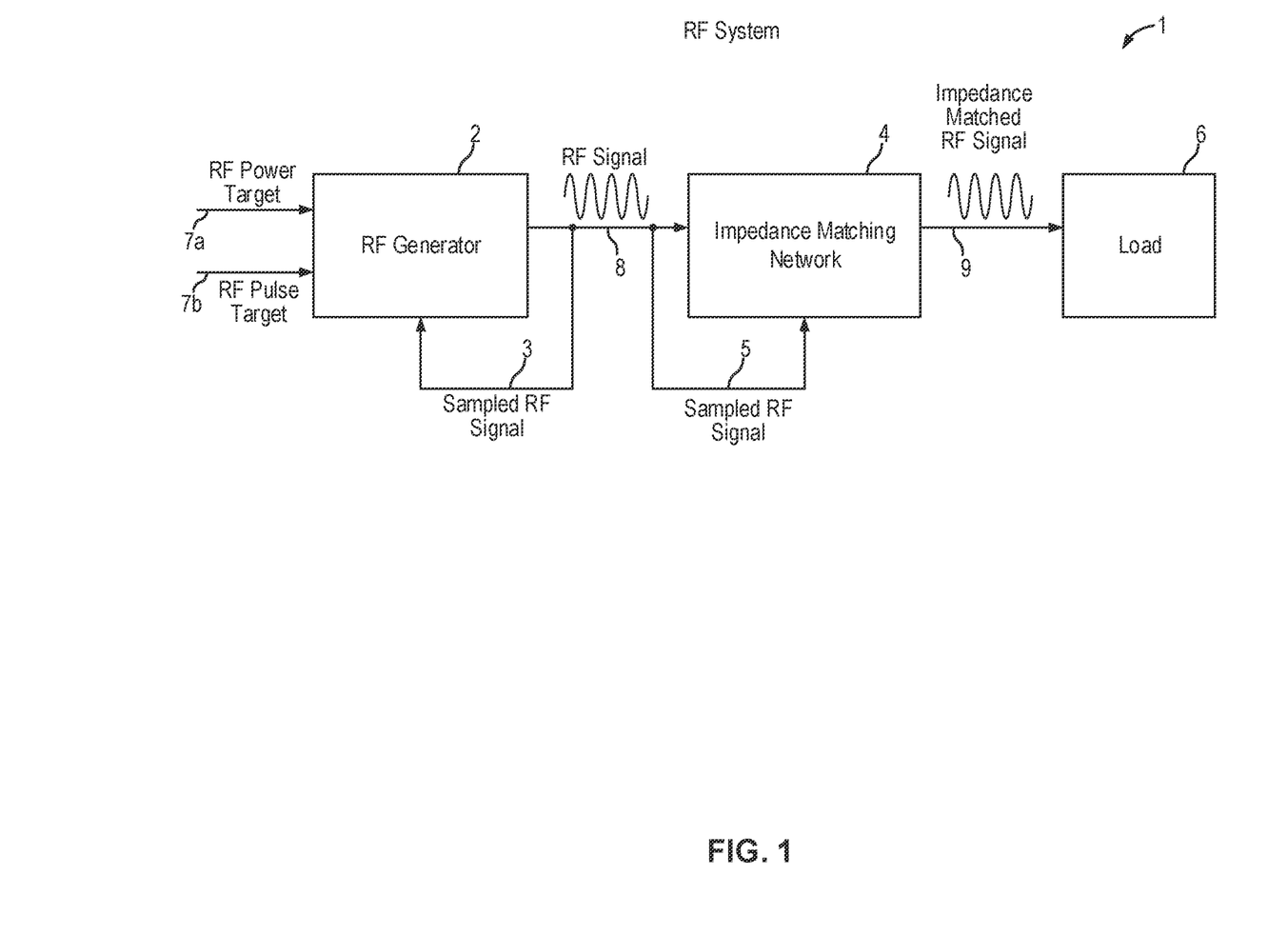
FIG. 1 is a schematic diagram of an RF system in which an RF generator is incorporated in some examples.

FIG. 1 is a schematic diagram of an RF system in which an RF generator is incorporated in some examples. Referring to FIG. 1, an RF system 1 is provisioned to supply an RF signal 8 to deliver RF power to a load 6. For example, the load 6 can be a semiconductor equipment, such as a plasma semiconductor equipment. The RF signal 8 can be applied to generate the plasma in a plasma tool, such as for etching a semiconductor component. The RF system 1 includes an RF generator 2 generating the RF signal 8 having a predetermined RF frequency. In some examples, the RF signal 8 can be a continuous wave, such as a sinusoidal waveform, where the amplitude and/or frequency of the sinusoidal waveform can be varied to vary the output power delivered to the load 6.

In other examples, the RF signal 8 can be a burst signal or a pulse-modulated RF signal, that is, the RF signal is provided in bursts of a sinusoidal signal of different pulse widths. In the present description, a pulse-modulated RF signal, also referred to as a "pulse RF signal," refers to a burst RF signal or a modulated RF signal. In other words, a pulse RF signal is an RF sinusoidal signal that is modulated by a pulse modulation control signal which defines an envelope for the modulated sinusoidal signal. In some examples, the RF sinusoidal signal is provided at a constant frequency and amplitude but the power delivery to the load is varied by varying the pulse modulation control signal.

The RF signal 8 generated by the RF generator 2 is provided to an impedance matching network 4 which generates an impedance matched RF signal 9 to provide to the load 6. In particular, the impedance matching network 4 operates to maximize the power provided to the load 6 and minimize the reflected power back to the RF generator. The impedance matching network 4 seeks to adjust the input impedance of the matching network to match the characteristics impedance of the transmission line connecting the RF generator 2 to the matching network 4. As a result, the impedance matching network 4 modifies the RF signal 8, such as the phase of the RF signal, to generate the impedance matched RF signal 9.

In the present example, the RF generator 2 receives an input signal "RF Power Target" 7a specifying the RF power level or levels to be delivered. In the case the RF generator 2 provides a pulse RF signal, the RF generator 2 may further receives a second input signal "RF Pulse Target" 7b specifying the pulse width or the pulse duration of the pulse RF signal. The RF generator 2 generates the pulse RF signal 8 in accordance with the power level(s) and pulse width indicated by the RF Power Target 7a and the RF Pulse Target 7b. Furthermore, the RF generator 2 implements RF signal level control by measuring or sampling the RF signal at its output terminal. The sampled RF signals 3, which usually includes the forward RF signal and the reflected RF signal, is fed back to the RF generator 2 to form the control loop for adjusting the level or the amplitude of the RF signal. Meanwhile, the impedance matching network 4 samples the pulse RF signal 8 and the sampled RF signal 5 is used to adjust the input impedance of the matching network to match the characteristics impedance of the transmission line connecting the RF generator 2 to the matching network 4, as described above.

Embodiments of the present disclosure describe an RF generator incorporating a pulse generator circuit for controlling the pulse modulation of the output RF signal.

Figure 2:
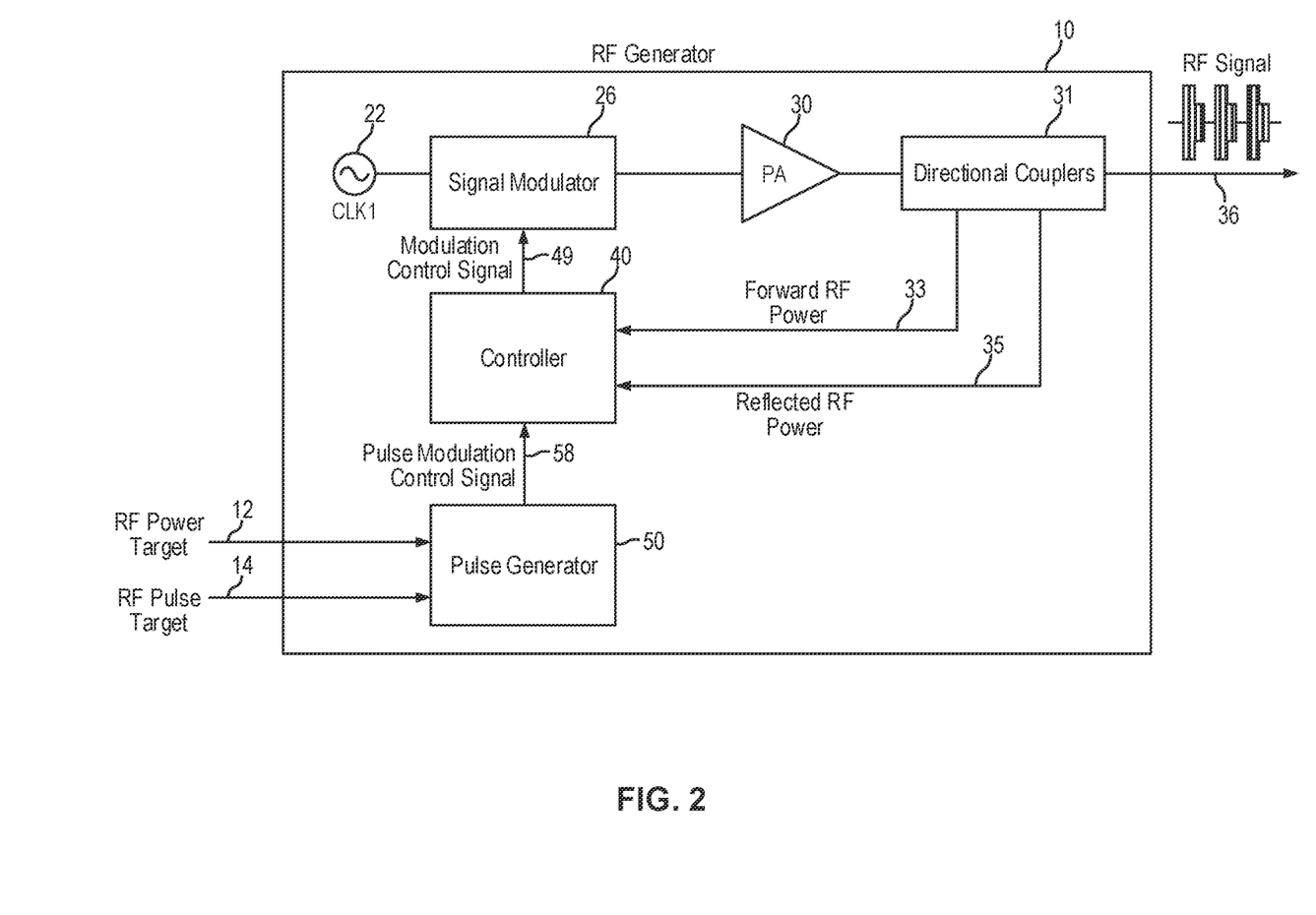
FIG. 2 is a schematic diagram of an RF generator incorporating a pulse generator circuit in embodiments of the present disclosure.

FIG. 2 is a schematic diagram of an RF generator incorporating a pulse generator circuit in embodiments of the present disclosure. Referring to FIG. 2, an RF generator 10 (also referred to as an "RF power supply") generates an RF signal from an RF signal source 22 and provides the RF signal an output terminal 36 for driving a load, usually via an impedance matching network. The RF generator 10 receives an input signal RF Power Target (node 12) and an input signal RF Pulse Target (node 14) specifying the desired power level(s) and the desired pulse width or pulse duration for the RF signal to be generated. In the present embodiment, the RF signal thus generated is a pulse-modulated RF signal or a pulse RF signal. In embodiments of the present disclosure, the RF Power Target signal 12 can include one or more RF power setpoints and the RF Pulse Target signal 14 can include one or more pulse duration setpoints.

The RF generator 10 includes a controller 40 forming a feedback control loop in the RF generator to regulate the power level or amplitude of the RF signal. In particular, the controller 40 generates a modulation control signal 49 to control the power level of the RF signal in response to the feedback control loop. The controller 40 is further in communication with a pulse generator circuit 50 to generate the modulation control signal 49 to control the pulse envelop of the output RF signal to provide the desired pulse modulation pattern. As a result, the controller 40 generates the output RF signal (node 36) having an amplitude indicative of the RF Power Target (node 12) and having a pulse envelope defined by the RF Pulse Target (node 14). The RF generator 10 may include other circuits and components not shown to support the functionality of the RF generator. Other circuits and components of the RF generator 10 are omitted in FIG. 2 to simplify the discussion.

More specifically, in RF generator 10, an oscillator 22 serves as the RF signal source and provides an RF source signal of a predetermined RF frequency as a function of an RF clock CLK1. In one example, the oscillator 22 generates the RF source signal being a fixed-amplitude sine wave at an RF frequency. The RF source signal is modulated by a signal modulator 26. In embodiments of the present disclosure, the signal modulator 26 is configured to gate or modulate the RF source signal to generate a pulse-modulated RF signal as the output RF signal. The signal modulator 26 is coupled to adjust the signal level or the amplitude of the RF source signal as well as to pulse modulate the RF source signal in response to the modulation control signal 49 from the controller 40. The modulated RF signal generated by the signal modulator 26 may be amplified by a power amplifier 30 by a predetermined amplification factor. The power amplifier 30 amplifies the power of the RF signal to realize a desired signal amplitude for the output RF signal. The RF signal thus generated is provided on the output terminal 36 and can be transmitted to the load on a transmission line, via an impedance matching network.

To realize feedback control, the RF signal is provided to the output terminal 36 through directional couplers 31. The directional couplers 31 attenuate and extract respective forward RF power (node 33) and reflected RF power (node 35) at the output terminal 36 where the sampled signals are used in the feedback control loop to adjust the amplitude level of the output RF signal. In some examples, a directional coupler samples a small fraction of the output power (the forward RF signal or the reflected RF signal) and diverts the sample to the controller 40. The controller 40 processes the forward and reflected RF signal samples to generate measured signal level values. The controller 40 then generates an error signal indicative of a difference between the measured signal level values of the RF signal and a reference signal level. In some embodiments, the reference signal level is indicated by the RF Power Target (node 12) indicating the desired RF power level or levels for the output RF signal. The controller 40 generates the modulation control signal 49 in response to the error signal to control the amplitude of the output RF signal through the signal modulator 26. As thus configured, the feedback control loop is formed in the RF generator 10 to enable the controller 40 to continuously monitor and control the output power level of the RF signal.

In operation, the controller 40 receives a pulse modulation control signal 58 from the pulse generator circuit 50. The pulse generator circuit 50 receives the RF Power Target (node 12) and the RF Pulse Target (node 14). The pulse generator circuit 50 generates the pulse modulation control signal 58 indicative of the desired power level as specified by the RF Power Target signal 12 and the desired pulse width as specified by the RF Pulse Target signal 14. In one embodiment, the pulse modulation control signal 58 is a signal having a signal level indicative of the desired power level and having a signal pulse width indicative of the desired pulse width. The pulse modulation control signal 58 is provided to the controller 40 as a reference signal level to use for controlling or adjusting the amplitude of the output RF signal in the feedback control loop. Furthermore, the signal pulse width of the pulse modulation control signal 58 is provided to the controller 40 to indicate the duration in time that the pulse modulation is to be applied to the RF signal to generate the pulse-modulated RF signal. In particular, the combination of the signal level and the signal pulse width of the pulse modulation control signal 58 specifies a shape or an envelope for the pulse-modulated RF signal. In other embodiments, the pulse modulation control signal 58 can be provided as two signals, one signal indicating the power level and another signal indicating the pulse duration. The exact structure of the pulse modulation control signal 58 is not critical to the practice of the present disclosure.

The controller 40 compares the forward RF Power signal 33 to the pulse modulation control signal 58 to create an error signal that drives the modulation control signal 49. As a result, the modulation control signal 49 drives the signal modulator 26 to modify the amplitude and to control the modulation of the RF source signal 22 to generate the output RF signal with the desired signal amplitude (or RF power level) and the desired pulse modulation pattern. In some examples, the signal modulator 26 can be a multiplier combining the RF source signal and the modulation control signal 49 provided by the controller 40.

In the present embodiment, the RF signal thus generated is a pulse-modulated RF signal. In the present description, a pulse-modulated RF signal, also referred to as a pulse RF signal, refers to an RF signal of a given RF frequency having an On period where the RF signal is provided at an output terminal and an Off period where no RF signal is provided. That is, the RF signal of the given RF frequency is provided only during the On period. The On period and the Off period may be repeated and the pulsed RF signal may have the same or different pulse widths for each pulse of the RF signal. Furthermore, in the present description, the pulse-modulated RF signal may have various pulse pattern during the On period where the pulse pattern is specified by the RF Power Target signal 12 and the RF Pulse Target signal 14. For example, the pulse pattern may include two or more power levels, each of the same or different durations. The pulse generator circuit 50 in the RF generator 10 of the present disclosure is configured to generate a pulse-modulated RF signal having any desired modulation pattern for optimal RF power delivery to the load.

Figure 3:
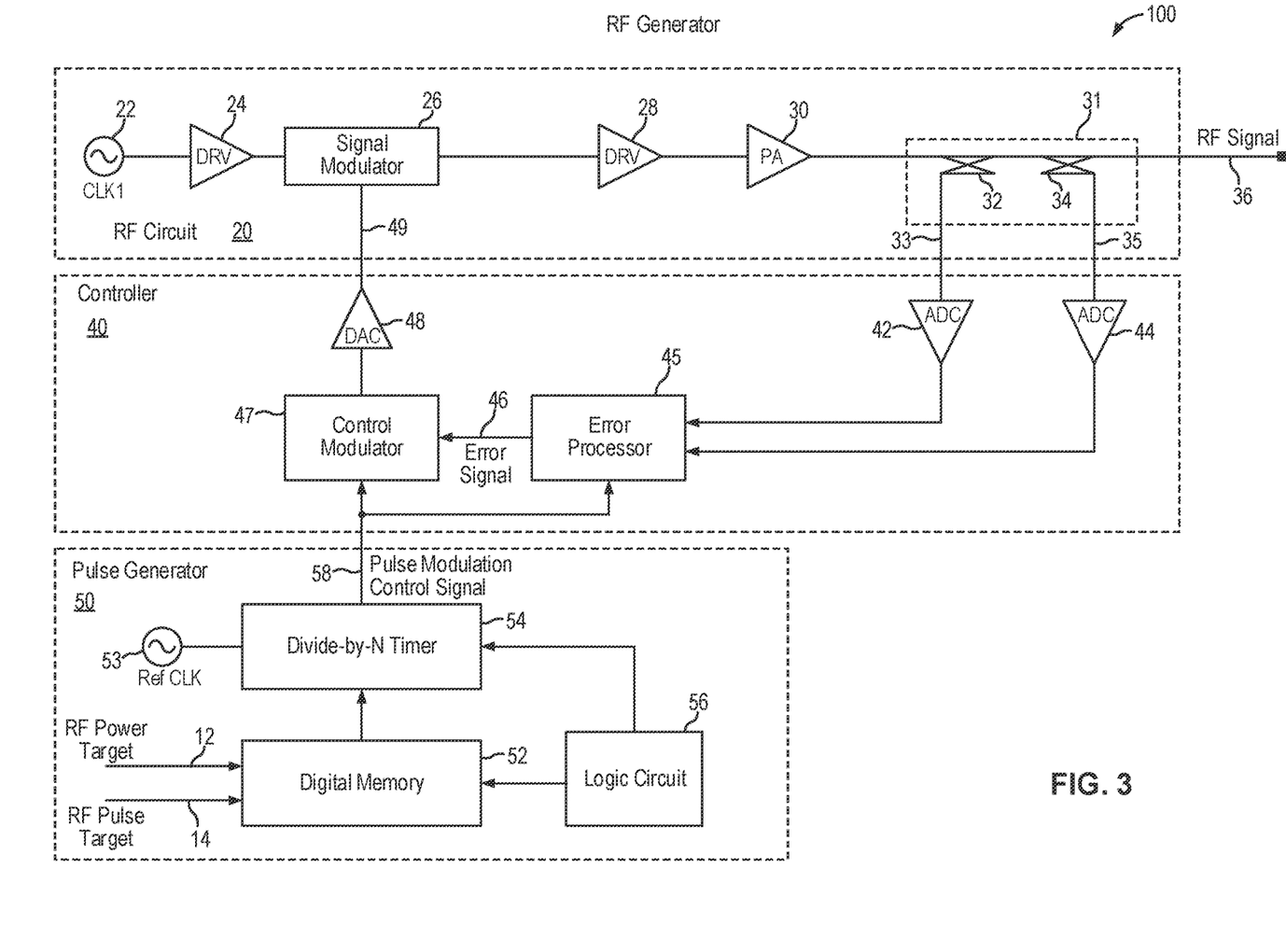
FIG. 3 is a schematic diagram of an RF generator incorporating a pulse generator circuit in embodiments of the present disclosure.

FIG. 3 is a schematic diagram of an RF generator incorporating a pulse generator circuit in embodiments of the present disclosure. Referring to FIG. 3, an RF generator 100 (also referred to as an "RF power supply") includes an RF circuit 20, a controller 40 and a pulse generator circuit 50. The RF generator 100 generates an RF signal from an RF signal source 22 and provides the RF signal an output terminal 36 for driving a load, usually via an impedance matching network. The RF generator 100 may include other circuits and components not shown to support the functionality of the RF generator. Other circuits and components of the RF generator 100 are omitted in FIG. 3 to simplify the discussion.

In RF circuit 20, an oscillator 22 generates the RF source signal of a predetermined RF frequency as a function of an RF clock CLK1. In one example, the oscillator 22 generates the RF source signal being a fixed-amplitude sine wave at the RF frequency. The RF source signal may be amplified by a driver 24. The RF source signal is then modulated by a signal modulator 26. The signal modulator 26 is configured to gate or modulate the RF source signal to generate a pulse-modulated RF signal as the output RF signal. The signal modulator 26 is coupled to adjust the signal level or the amplitude of the RF source signal as well as to pulse modulate the RF source signal in response to a modulation control signal 49 from the controller 40. The modulated RF signal may be further amplified by a driver 28 and a power amplifier 30. For example, the power amplifier 30 amplifies the power of the RF signal outputted from the signal modulator 26 by a predetermined amplification factor. The power amplifier 30 amplifies the power of the RF signal to realize a desired signal amplitude for the output RF signal. The RF signal thus generated is provided on the output terminal 36 and can be transmitted to the load on a transmission line to the load, via an impedance matching network.

To realize feedback control, the RF signal is provided to the output terminal 36 of the RF circuit 20 through a pair 31 of directional couplers 32, 34. The directional couplers 32, 34 attenuate and extract respective forward power (node 33) and reflected power (node 35) at the output terminal 36 where the sampled signals are used for monitoring of the output level of the RF generator 100. In other words, each directional coupler samples a small fraction of the output power (the forward RF signal or the reflected RF signal) and diverts the sample to the controller 40.

In the present embodiment, in the controller 40, samples of the forward RF signal outputted by the directional coupler 32 is provided to an analog-to-digital converter (ADC) 42 to be converted to digital data samples. Similarly, samples of the reflected RF signal outputted by the directional coupler 34 is provided to an analog-to-digital converter (ADC) 44 to be converted to digital data samples. The digital data samples of the forward and reflected RF signals are the processed by an error processor 45. The error processor 45 generates an error signal (node 46) indicative of a difference between the measured signal level values of the RF signal, as indicated by the digital data samples, and a reference signal level. In embodiments of the present disclosure, the reference signal level is indicative by the pulse modulation control signal 58 generated by the pulse generator circuit 50, as will be explained in more detail below.

The controller 40 includes a control modulator 47 which combines the error signal 46 and the pulse modulation control signal 58 to generates a modulation control signal 49. In some embodiments, the modulation control signal 49 is a digital signal and is converted to analog form by a digital-to-analog converter 48. The converted modulation control signal is then provided to the signal modulator 26 to control the modulation of the RF source signal 22 and also to modify the level or amplitude of the RF source signal 22 to generate the output RF signal on output terminal 36 with the desired pulse modulation and the desired signal amplitude. As thus configured, a feedback control loop is formed in the RF generator 100 to enable the controller 40 to continuously monitor and control the output power or output level of the RF signal. The controller 40 generates the pulse RF signal (node 36) having an amplitude indicative of the RF Power Target (node 12) and having a pulse envelope defined by the RF Pulse Target (node 14). In some embodiments, the signal modulator 26 is a multiplier combining the RF source signal 22 and the modulation control signal 49 provided by the controller 40.

In the present description, the RF signal thus generated is a pulse-modulated RF signal. The pulse-modulated RF signal can have any pulse shape or pulse envelop as defined by the RF Power Target and the RF Pulse Target. The RF generator 100 includes the pulse generator circuit 50 to generate the pulse modulation control signal 58 containing information for the desired signal level and desired pulse duration for the pulse-modulated RF signal, which in combination, specify a shape or an envelope for the pulse-modulated RF signal.

In some embodiments, the pulse generator circuit 50 includes a digital memory 52 including a series of memory locations, each memory location storing a power level and a pulse duration for a segment of the pulse RF signal to be generated. The pulse generator circuit 50 also includes a divide-by-N timer 54 in communication with the digital memory 52 to generate the pulse modulation control signal 58 for the controller 40. A logic circuit 56 control the operation of the divide-by-N timer 54 and the digital memory 52.

In some embodiments, the digital memory 52 is an array of randomly accessible memory cells, such as DRAM memory cells or SRAM memory cells. In some embodiments, the digital memory 52 includes a given number of memory locations to support the programming of any pulse patterns for the pulse RF signal, including complex pulse patterns.

In some embodiments, the divide-by-N timer 54, also referred to as a divide-by-N clock or divide-by-N counter, is a circuit for dividing a reference clock signal. For example, the divide-by-N timer 54 receives a reference clock signal 53 having a clock frequency $F=1/T$, where T denotes the clock period T of the reference clock signal. The divide-by-N timer 54 generates an output clock signal (also referred to as a "timing signal") which is reset at the Nth clock pulse of the reference clock signal. In this way, the divide-by-N timer is used to specify a given time duration with reference to the frequency or clock period of the reference clock signal.

More specifically, the divide-by-N timer generates an output clock signal having a frequency being F divided by $2^N$ and a corresponding period being T multiplied by 2N. For example, for N=1, the divide-by-N Timer 54 generates an output clock signal having a frequency of 1/2T and a period of 2T. For N=2, the divide-by-N Timer 54 generates an output clock signal having a frequency of 1/4T and a period of 4T. In some embodiments, the divide-by-N timer 54 is implemented as one or more D flip-flops. In the case of two or more D flip-flops, the D flip-flops are connected in a serial chain.

In embodiments of the present disclosure, the divide-by-N timer 54 and the digital memory 52 operate under the control of the logic circuit 56 to generate the pulse modulation control signal 58 in response to the RF Power Target 12 and the RF Pulse Target 14. In particular, the RF Power Target signal 12 and the RF Pulse Target signal 14 provide setpoints which together specify the pulse pattern to be applied to the pulse-modulated RF signal. In the present embodiment, each pulse pattern is divided into pulse segments (or "segments") where each pulse segment is a portion or an interval of the pulse pattern having the same power level.

In digital memory 52, each digital memory location stores data associated with a pulse segment or a pulse interval of the desired pulse pattern as programmed by the RF Power Target signal 12 and the RF Pulse Target signal 14. In some embodiments, each digital memory location stores two values for each pulse interval: (1) the pulse interval's output power level and (2) the pulse interval's duration in time. The power level number stored for each pulse interval is used by the pulse generator circuit 50 to set the signal level of the pulse modulation control signal 58. The signal level of the pulse modulation control signal 58 is provided to the controller 40 to adjust the power level of the RF signal in the feedback control loop. In the present embodiment, the signal level of the pulse modulation control signal 58 is provided to the error processor 45 of controller 40.

Meanwhile, the interval duration number stored for each pulse interval is provided to the divide-by-N timer 54 to count the clock pulses of the reference clock signal based on the interval duration number. In other words, the interval duration number is used to set the Nth clock pulse of the reference clock signal 53 at which point the interval duration expires and the output clock signal (or the timing signal) of the divide-by-N timer 54 reset. The timing signal of the divide-by-N timer 54 is used to set the pulse width or pulse duration of the pulse modulation control signal 58 which is used to control the pulse envelope of the RF signal. The pulse modulation control signal 58 thus generated, including a signal level indicative of the desired power level and a signal pulse width indicative of the desired pulse duration, is provided to the controller 40.

In operation, when the timer reaches the programmed time interval, indicating the pulse segment has completed, the digital memory 52 advances digital memory location to the next pulse interval. The sequence is continued until a memory location is reached that contains an "end power level "or an "end duration value." The end power level or end duration value points the operation back to the beginning memory location. As thus, configured, the pulse generator 50 can be programmed to generate pulse pattern of any complexity level. The complexity of a pulse modulation pattern is only limited by the number of the digital memory locations provided in digital memory 52.

Figures 4, 4A, 4B:
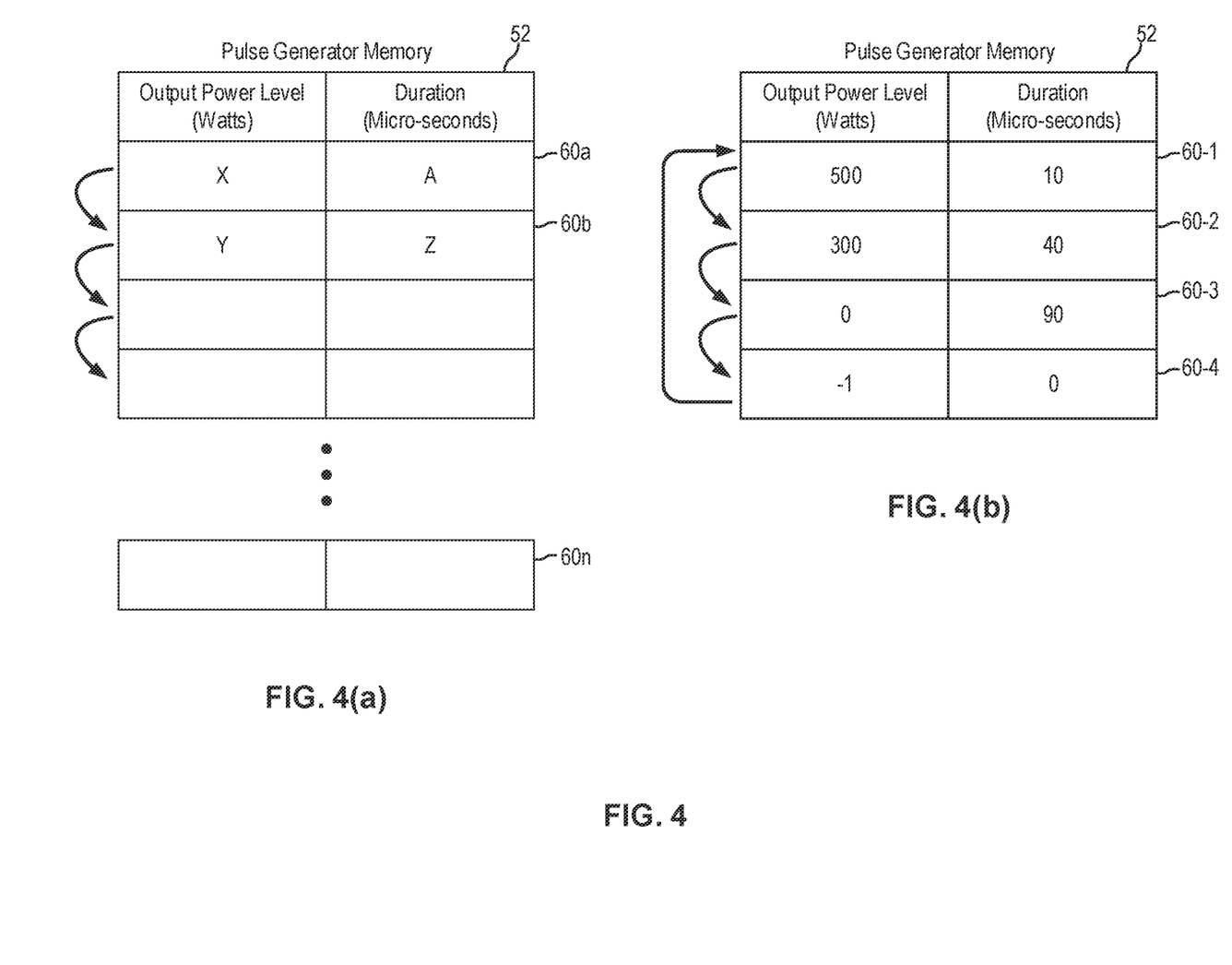

FIG. 4, which includes FIGS. 4(a) and 4(b), illustrates the configuration of the digital memory in the pulse generator circuit in embodiments of the present disclosure. Referring to FIG. 4(a), a digital memory 52 in the pulse generator circuit 50 includes a series of digital memory locations 60a to 60n. In the present embodiment, each memory location 60 stores a pair of values specifying the power level and the time duration of a pulse interval or a pulse segment of a pulse RF signal pattern. Specifically, the output power level (e.g. in unit of Watts) and the duration (e.g. in unit of micro-seconds) for a given pulse interval is stored in each memory location 60. A series of memory locations 60a to 60n stores a sequence of pulse intervals for defining a pulse pattern. The digital memory 52 operates by starting at a beginning memory location, such as memory location 60a, and incrementing to each subsequent memory location until a memory location with an end power level or end duration value is reached. In that case, the digital memory 52 returns to the beginning memory location 60a and the sequence is repeated.

In one example, a simple On-Off pulse pattern requires the programming of 3 memory locations. At a first memory location: the values (500, 10) are stored for a pulse interval having a power level of 500 watts and a duration of 10 μs (On period). At a second memory location, the values (0, 90) are stored for a pulse interval having 0 watts and a duration of 90 μs (Off period). At a third memory location, the values (−1, 0) are stored to represent the end of the pulse sequence. In the present example, the power level of "−1" indicates the end power level and the time duration of "0" indicates the end duration value. The pulse RF signal specified by these three memory locations will be as follows. The 'On' power in the first memory location is 500 watts and lasts for a duration of 10 μs. The second memory location holds the 'Off' power of 0 watts for 90 μs. When the third memory location is reached, the end of pulse sequence is indicated and the memory pointer is immediately returned to the first memory location and the process repeats to generate the pulse pattern. The pulse pattern thus generated has a repetition rate of 10 KHz and a duty cycle of 10%.

Figure 5A:
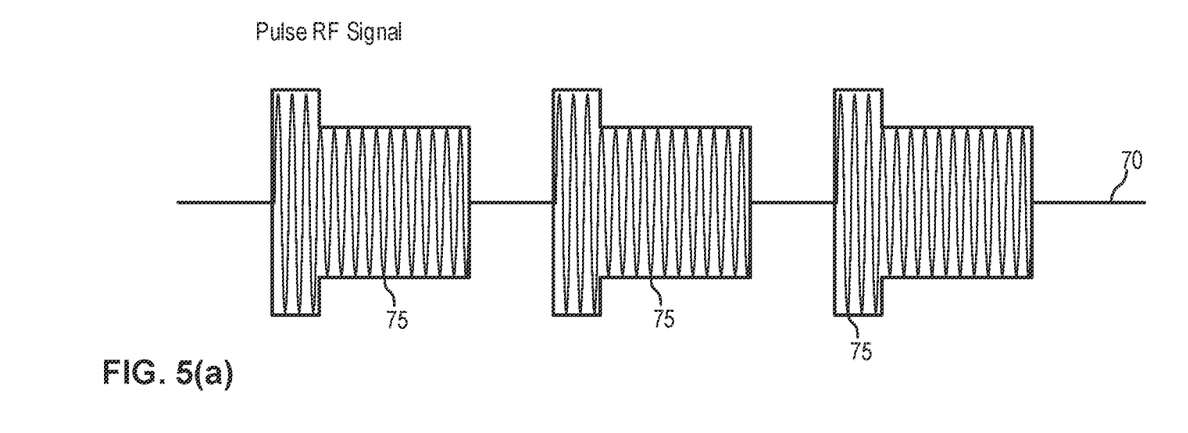

FIG. 4(b) depicts another example of a pulse pattern that can be generated using the pulse generator circuit 50 in embodiments of the present disclosure. Referring to FIG. 4(b), the digital memory 52 includes a number of memory locations 60 storing pairs of data values specifying the power level and the time duration of a pulse interval. At a memory location 60-1: the values (500, 10) are stored. At memory location 60-2, the values (300, 40) are stored. At memory location 60-3, the values (0, 90) are stored. At memory location 60-4, the values (−1, 0) are stored to indicate the end of the pulse pattern sequence. The pulse RF signal specified by these four memory locations is as follows and is also shown in FIG. 5(a). The 'On' power in the first memory location is 500 watts and lasts for a duration of 10 µs. The 'On' power in the second memory location is 300 watts and lasts for a duration of 40 µs. The third memory location holds the 'Off' power of 0 watts for 90 µs. When the fourth memory location is reached, the memory pointer is returned to the first memory location 60-1 and the pulse pattern repeats by applying the values stored in each memory location in sequence from the first memory location 60-1 to the last memory location 60-4.

Figure 5B:
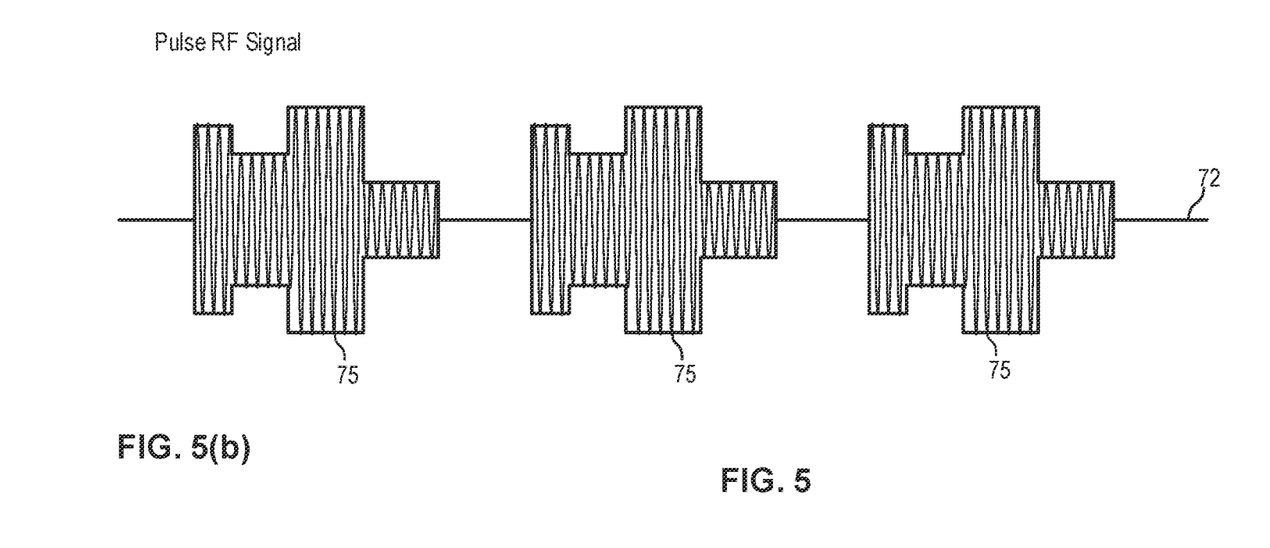

FIG. 5, which includes FIGS. 5(a) and 5(b), includes exemplary pulse-modulated RF signal waveforms which can be generated by the pulse generator circuit of the RF generator in embodiments of the present disclosure. Referring to FIG. 5(a), a pulse-modulated RF signal 70 includes a pulse pattern where the On-period has two different signal levels and with different pulse durations. In particular, the pulse-modulated RF signal 70 of FIG. 5(a) is specified by the power and duration values stored in the digital memory 52 in FIG. 4(b).

FIG. 5(b) illustrates another example of a complex pulse pattern of a pulse RF signal which can be generated using the pulse generator circuit of the present disclosure. Referring to FIG. 5(b), the pulse RF signal 72 includes multiple signal levels during the On-period, where each signal level has different durations. The pulse pattern of FIG. 5(b) can be programmed using six memory locations in the digital memory of the pulse generator circuit.

The curves 70 and 72 in FIGS. 5(a) and 5(b) denote the pulse envelopes of the pulse-modulated RF signal. During each On-period, the pulse-modulated RF signal provides an RF signal 75 having predetermined RF frequency and having an amplitude defined by the pulse pattern. In the present example, the RF signal 75 is a sinusoidal waveform at the RF frequency. In the examples shown in FIGS. 5(a) and 5(b), the underlying sinusoidal waveform of the RF signal 75 is modulated by the pulse envelopes 72, 74 to generate the respective pulse-modulated RF signals.

The pulse generator circuit 50 of the present disclosure can be advantageously applied to generate complex pulse pattern to use as the pulse RF signal, thereby enabling enhanced process control. The simplistic and ease of implementation of the pulse generator circuit of the present disclosure is not achievable by convention solutions.

Figure 6:
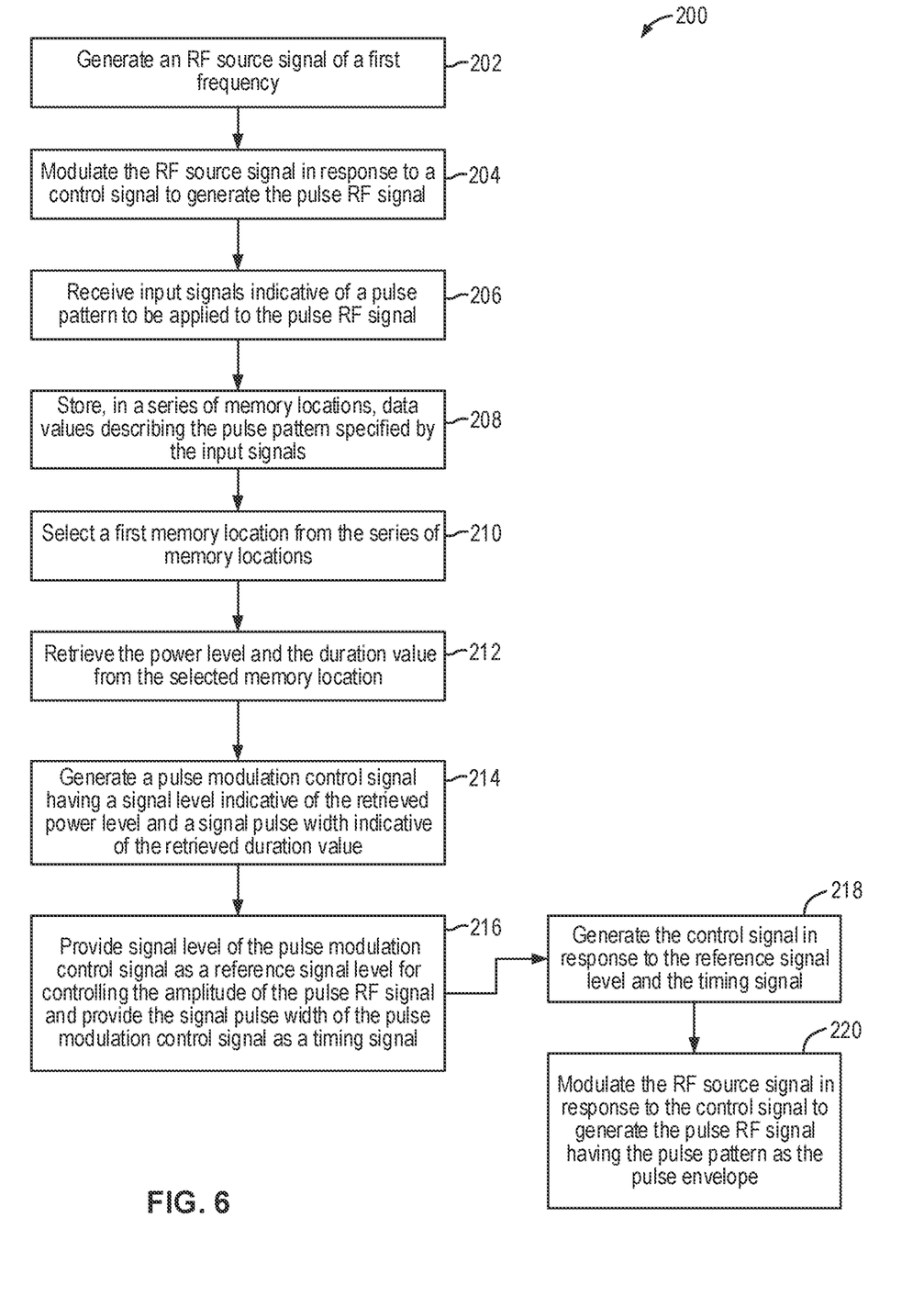
FIG. 6 is a flowchart illustrating a method for generating a pulse-modulated RF signal in an RF generator in embodiments of the present disclosure.

FIG. 6 is a flowchart illustrating a method for generating a pulse-modulated RF signal in an RF generator in embodiments of the present disclosure. Referring to FIG. 6, a method 200 for generating a pulse-modulated RF signal (or pulse RF signal) starts by generating an RF source signal of a first frequency (202). The method 200 then modulates the RF source signal in response to a control signal to generate the pulse RF signal (204).

The method 200 receives input signals indicative of a pulse pattern to be applied to the pulse RF signal (206). In particular, the pulse pattern defines a pulse envelope of the pulse RF signal. In some examples, the input signals can be the RF Power Target and RF Pulse Target signals described above. The method 200 stores, in a series of memory locations, data values describing the pulse pattern specified by the input signals (208). In some embodiments, each memory location stores data including a power level and a duration value for a respective segment of the pulse pattern. The series of memory locations include a last memory location storing an end power level or an end duration value.

The method 200 select a first memory location from the series of memory locations (210). The method 200 retrieves the power level and the duration value from the selected memory location (212). The method 200 generates a pulse modulation control signal having a signal level indicative of the retrieved power level and a signal pulse width indicative of the retrieved duration value. (214). The method 200 provides signal level of the pulse modulation control signal as a reference signal level for controlling the amplitude of the pulse RF signal and provides the signal pulse width of the pulse modulation control signal as a timing signal (216). The combination of the reference signal level and the timing signal defines the pulse envelope of the pulse-modulated RF signal. The method 200 generates the control signal in response to the reference signal level and the timing signal (218). The method 200 modulates the RF source signal in response to the control signal to generate the pulse RF signal having the pulse pattern as the pulse envelope (220).

In some embodiments, when the timing signal indicates the duration for each segment expires, the method 200 moves to the next memory location and repeats the process until the method 200 reaches the last memory location with the end power level or the end duration value. In response to reaching the last memory location, the method 200 returns to the first memory location and the process repeats to generate the pulse RF signal having the desired pulse pattern.

In embodiments of the present disclosure, the pulse generator circuit 50 described above may be embodied as a device, system, method or computer program product. Accordingly, aspects of this disclosure, generally referred to herein as circuits, modules, components or systems, may be embodied in hardware, in software (including firmware, resident software, micro-code, etc.), or in any combination of software and hardware, including computer program products embodied in a non-transitory computer-readable medium having computer-readable program code embodied thereon. In some embodiments, the pulse generator circuit 50 is implemented as a system including a hardware processor and a memory coupled with the hardware processor where the processor is configured to execute instructions stored in the memory to implement the functions of generating the pulse modulation control signal in response to the RF Power target signal and the RF Pulse target signal, as described above. The instructions may be program code, software code or software program residing in firmware and/or on computer useable medium having control logic for enabling execution on the processor. For example, in some embodiments, the logic circuit 56 in the pulse generator circuit 50 may be a hardware processor in communication with a memory storing program code or instructions, the divide-by-N timer 54 may be implemented in software or firmware stored in the memory, and the digital memory 52 may be implemented using the embedded memory in the hardware processor. The hardware processor in the pulse generator circuit 50 executes program code or instructions stored in the memory to perform the operation of the divide-by-N timer to generate the pulse modulation control signal.

In this detailed description, various embodiments or examples of the present invention may be implemented in numerous ways, including as a process; an apparatus; a system; a composition of matter, a computer program product embodied on a non-transitory computer readable storage medium; and/or a processor, such as a hardware processor or a processor device, configured to execute instructions stored on and/or provided by a memory coupled to the processor; and/or a series of program instructions on a non-transitory computer-readable medium (e.g., a computer-readable storage medium or a computer network where the program instructions are sent over optical, electronic, or wireless communication links). In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A radio frequency generator, comprising:
   a radio frequency (RF) circuit comprising an RF signal source providing an RF source signal of a first frequency and a signal modulator generating a pulse radio frequency (RF) signal having an On period where the RF signal is provided at an output terminal and an Off period where no RF signal is provided;
   a control circuit configured to sample the pulse RF signal at the output terminal and to generate a control signal responsive to at least the sampled pulse RF signal to modulate the RF signal at the radio frequency circuit; and
   a pulse generator circuit configured to receive input signals indicative of a pulse pattern defining a pulse envelope of the pulse RF signal, the pulse generator circuit storing data values defining power levels and durations for segments of the pulse pattern, the pulse generator circuit generating a pulse modulation control signal for each segment responsive to the stored data values, the pulse modulation control signal being indicative of the power level and the duration of each segment of the pulse pattern, the pulse modulation control signal being provided to the control circuit to generate the control signal to adjust an amplitude and to modulate the RF source signal to generate the pulse RF signal having the pulse pattern as the pulse envelope.

2. The radio frequency generator of claim 1, wherein the control circuit provides the control signal to the signal modulator of the radio frequency circuit to control the amplitude and the modulation of the RF source signal to generate the pulse RF signal.

3. The radio frequency generator of claim 1, wherein the pulse generator circuit comprises:
   a digital memory comprising a plurality of memory locations, each memory location storing a power level and a duration value associated with a respective segment of the pulse pattern, and a last memory location storing an end power level or an end duration value; and
   a divide-by-N timer receiving the duration value for a respective segment from a respective memory location and generating a first signal indicative of the duration value of the respective segment,
   wherein the pulse generator circuit provides the stored power level from a respective memory location as a signal level of the pulse modulation control signal and provides the first signal indicative of the duration value stored at the same memory location as a pulse width of the pulse modulation control signal, the pulse modulation control signal being provided to the control circuit to generate the control signal to modulate the RF source signal to generate the pulse RF signal having the pulse envelope comprising respective segments of the pulse pattern.

4. The radio frequency generator of claim 3, wherein the pulse generator circuit selects the memory locations in the digital memory in sequence from a first memory location to the last memory location, the pulse generator circuit generating the pulse modulation control signal using the duration value of each selected memory location and the power level of the same selected memory location, the pulse generator circuit returning to the first memory location in response to selecting the last memory location.

5. The radio frequency generator of claim 3, wherein divide-by-N timer counts clocking pulses of a reference clock signal based on the duration value and resetting the pulse width of the pulse modulation control signal at the expiration of the duration value to indicate an end of the respective segment.

6. The radio frequency generator of claim 3, wherein the divide-by-N timer comprises a plurality of D flip-flops connected in a serial chain.

7. The radio frequency generator of claim 1, wherein the pulse pattern comprises two or more segments, each segment including a portion of the pulse pattern having the same power level.

8. The radio frequency generator of claim 7, wherein the pulse pattern comprises a plurality of segments, each segment having a different power level than at least one other segment and each segment having a different duration than at least one other segment.

9. The radio frequency generator of claim 1, wherein control circuit further comprises:
   first and second analog-to-digital converters configured to sample respective forward RF signal and reflected RF signal at the output terminal and to generate digital samples of the respective forward and reflected RF signals;

an error processor configured to compare a measured signal level value to a reference signal level to generate an error signal indicative of a difference thereof, the measured signal level being derived from the digital samples of the respective forward and reflected RF signals and the reference signal level being the power level indicated by the pulse modulation control signal provided by the pulse generator circuit; and a control modulator configured to generate the control signal in response to the error signal and the pulse modulation control signal generated by the pulse generator circuit, the pulse modulation control signal indicating the duration of each segment of the pulse pattern to be applied to the pulse RF signal.

10. The radio frequency generator of claim 1, further comprising:

a digital-to-analog convert configured to convert the control signal to an analog signal and to couple the analog signal to control the signal modulator of the radio frequency circuit.

11. The radio frequency generator of claim 1, wherein the digital memory comprises a plurality of randomly accessible memory cells.

12. The radio frequency generator of claim 1, wherein the pulse generator circuit comprises a hardware processor and a memory coupled with the hardware processor, wherein the memory is configured to provide the processor with instructions which when executed cause the processor to:

receive the input signals indicative of the pulse pattern defining a pulse envelope of the pulse RF signal;

store the data values defining power levels and durations for segments of the pulse pattern;

generate the pulse modulation control signal for each segment responsive to the stored data values, the pulse modulation control signal being indicative of the power level and the duration of each segment of the pulse pattern; and provide the pulse modulation control signal to the control circuit to generate the control signal to adjust an amplitude and to modulate the RF source signal to generate the pulse RF signal having the pulse pattern as the pulse envelope.

13. A method of generating a pulse radio frequency (RF) signal in an RF generator, comprising:

generating an RF source signal of a first frequency;

modulating the RF source signal in response to a control signal to generate the pulse RF signal;

receiving input signals indicative of a pulse pattern to be applied to the pulse RF signal, the pulse pattern defining a pulse envelope of the pulse RF signal;

storing, in a series of memory locations, data values describing the pulse pattern specified by the input signals, each memory location storing data comprising a power level and a duration value for a respective segment of the pulse pattern, the series of memory locations comprising a last memory location storing an end power level or an end duration value;

selecting a first memory location from the series of memory locations;

retrieving the power level and the duration value from the selected memory location;

generating a pulse modulation control signal having a signal level indicative of the retrieved power level and a signal pulse width indicative of the retrieved duration value;

providing the signal level of the pulse modulation control signal as a reference signal level for controlling the amplitude of the pulse RF signal;

providing the signal pulse width of the pulse modulation control signal as a timing signal;

generating the control signal in response to the reference signal level and the timing signal; and modulating the RF source signal in response to the control signal to generate the pulse RF signal having the pulse pattern as the pulse envelope.

14. The method of claim 13, further comprising:

selecting the memory location in the series of memory locations in sequence from the first memory location to the last memory location;

for each selected memory location, repeating retrieving the RF power level and the duration value to modulating the RF source signal to generate the pulse RF signal having the pulse pattern as the pulse envelope; and in response to the last memory location being selected, return to the first memory location and repeating selecting the memory location at the first memory location.

15. The method of claim 13, wherein modulating the RF source signal in response to the control signal comprises:

modulating the RF source signal in response to the control signal to control the amplitude and the width of the RF source signal to generate the pulse RF signal having the pulse pattern as the pulse envelope.

16. The method of claim 13, wherein generating a pulse modulation control signal having a signal level indicative of the retrieved power level and a signal pulse width indicative of the retrieved duration value comprises:

generating, using a divide-by-N timer, the pulse modulation control signal having a signal pulse width indicative of the duration value associated with the segment of the pulse pattern stored in the selected memory location.

17. The method of claim 16, wherein generating, using the divide-by-N timer, the pulse modulation control signal comprises:

counting, based on the duration value, clocking pulses of a reference clock signal;

resetting the timing signal at the expiration of the duration value to indicate an end of the respective segment.

18. The method of claim 13, wherein the pulse pattern comprises two or more segments, each segment including a portion of the pulse pattern having the same power level.

19. The method of claim 18, wherein the pulse pattern comprises a plurality of segments, each segment having a different power level than at least one other segment and each segment having a different duration than at least one other segment.

20. The method of claim 13, further comprising:

sampling a forward RF signal and a reflected RF signal relating to the pulse RF signal to generate digital samples of the forward RF signal and the reflected RF signal;

processing the selected digital samples to generate a measured signal level value;

determining an error signal indicative of a difference between the measured signal level value and the reference signal level;

generating the control signal in response to the error signal and the timing signal, the timing signal indicating the durations of the segments of the pulse pattern to be applied to the pulsed RF signal; and applying the control signal to modulate the RF source signal to generate the pulse RF signal having the pulse pattern.

\* \* \* \* \*